United States Patent
Huang et al.

(10) Patent No.: US 10,217,396 B2
(45) Date of Patent: Feb. 26, 2019

(54) DISPLAY DRIVER INTEGRATED CIRCUIT AND DISPLAY SYSTEM INCLUDING THE SAME

(71) Applicant: SAMSUNG ELECTRONICS CO., LTD., Suwon-si (KR)

(72) Inventors: Roots Huang, Zhubei (TW); Ken Peng, Taipei (TW); Jae Yoon Kim, Seoul (KR); Ryan Wang, Taipei (TW)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 46 days.

(21) Appl. No.: 15/434,604

(22) Filed: Feb. 16, 2017

(65) Prior Publication Data

US 2017/0243532 A1     Aug. 24, 2017

(30) Foreign Application Priority Data

Feb. 19, 2016 (KR) .................. 10-2016-0019952

(51) Int. Cl.
*G09G 3/20* (2006.01)
*H02M 3/07* (2006.01)
*H03K 19/0175* (2006.01)
*G06F 1/3206* (2019.01)
*G06F 1/3218* (2019.01)

(52) U.S. Cl.
CPC ............ *G09G 3/2092* (2013.01); *H02M 3/07* (2013.01); *H03K 19/017509* (2013.01); *G06F 1/3206* (2013.01); *G06F 1/3218* (2013.01); *G09G 2300/043* (2013.01); *G09G 2310/0289* (2013.01); *G09G 2310/0291* (2013.01); *G09G 2310/0297* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 6,646,415 B1 * | 11/2003 | Nebrigic | H01M 6/5044 320/107 |
| 6,717,459 B2 | 4/2004 | Blodgett | |
| 7,859,134 B2 | 12/2010 | Chi et al. | |
| 7,875,996 B2 | 1/2011 | Nguyen et al. | |
| 8,294,442 B2 | 10/2012 | Zhu | |
| 8,872,492 B2 | 10/2014 | Zhang et al. | |
| 9,093,038 B2 | 7/2015 | Han et al. | |
| 2011/0080433 A1 | 4/2011 | Park | |
| 2014/0266317 A1 | 9/2014 | Sessions | |
| 2016/0189608 A1 * | 6/2016 | Park | G09G 3/3225 345/212 |

FOREIGN PATENT DOCUMENTS

| JP | 4905635 B2 | 3/2012 |
|---|---|---|
| KR | 10-0732837 B1 | 6/2007 |

* cited by examiner

*Primary Examiner* — Joseph R Haley
(74) *Attorney, Agent, or Firm* — Sughrue Mion, PLLC

(57) ABSTRACT

A display driver integrated circuit (IC) and a display system including the same are provided. The display driver IC includes: a charge pump including a first node and a second node; a flying capacitor connected between the first node and the second node; a voltage regulator; a first switch connected between an output terminal of the voltage regulator and one of the first node and the second node; and a second switch connected between a ground and the other of the first node and the second node.

17 Claims, 15 Drawing Sheets

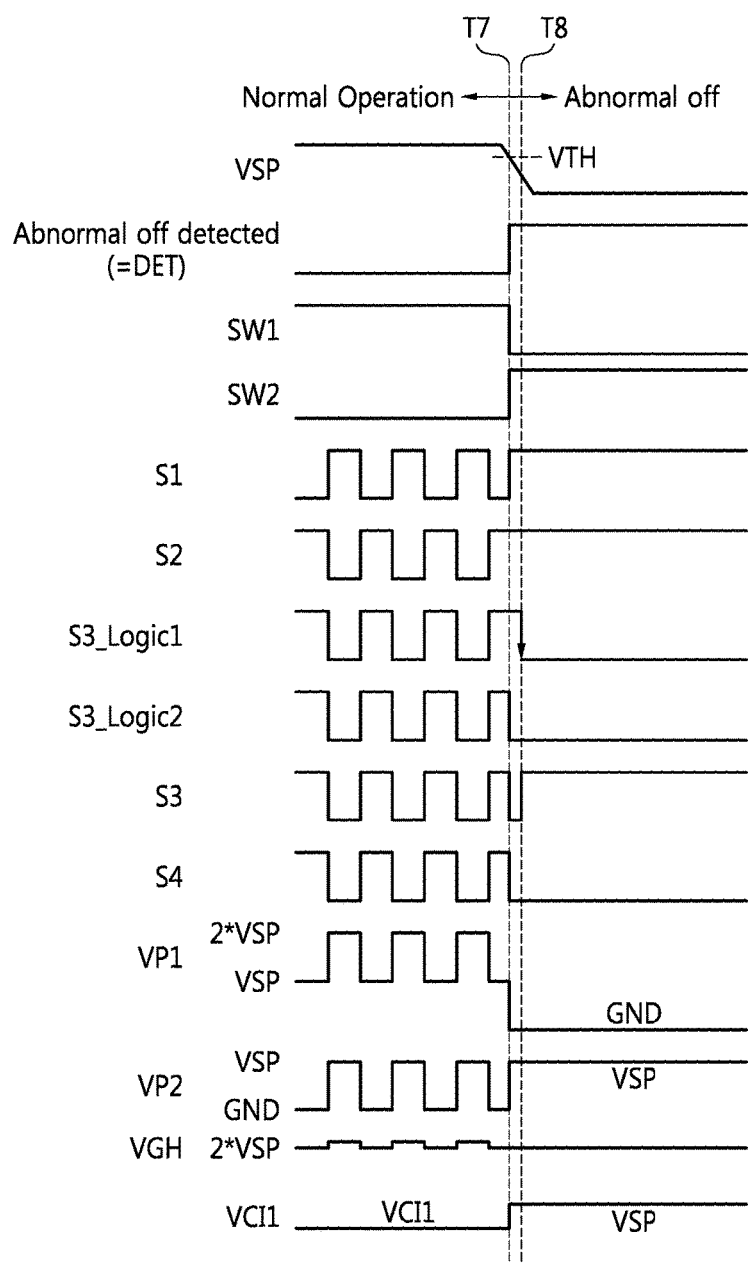

DISPLAY DRIVER INTEGRATED CIRCUIT AND DISPLAY SYSTEM INCLUDING THE SAME

CROSS-REFERENCE TO RELATED APPLICATION

This application claims priority under 35 U.S.C. § 119(a) from Korean Patent Application No. 10-2016-0019952, filed on Feb. 19, 2016 in the Korean Intellectual Property Office (KIPO), the disclosure of which is hereby incorporated by reference in its entirety.

BACKGROUND

Apparatuses and methods consistent with one or more exemplary embodiments relate to a display driver integrated circuit (IC), and more particularly, to a display driver IC including a circuit for preventing functional error and image sticking from occurring in a display panel when operating voltages supplied from a capacitor-less voltage regulator to gate driver circuits and source driver circuits are abnormally cut off, and to a display system including the same.

A display driver IC (DDI) system including a DDI includes multiple power sources and external capacitors to supply power. However, in order to reduce a volume, to increase an assembly yield, and to cut down cost, reducing the number of external capacitors of a DDI system is an important consideration for a display panel module.

A voltage regulator that does not include an external capacitor storing charges generated by the voltage regulator is called a capacitor-less voltage regulator. A general DDI including a capacitor-less voltage regulator includes gate driver circuits and source driver circuits to drive pixels included in a display panel. The capacitor-less voltage regulator generates operating voltage supplied to the gate driver circuits and the source driver circuits using power. When the power supplied to the capacitor-less voltage regulator is abnormally cut off, the operating voltages supplied to the gate driver circuits and the source driver circuits are also cut off. As a result, functional error and image sticking may occur in the display panel driven by the gate driver circuits and the source driver circuits.

SUMMARY

According to aspects of one or more exemplary embodiments, there is provided a display driver integrated circuit (IC) including: a charge pump including a first node and a second node; a flying capacitor connected between the first node and the second node; a voltage regulator; a first switch connected between an output terminal of the voltage regulator and one of the first node and the second node; and a second switch connected between a ground and the other of the first node and the second node.

According to aspects of one or more other exemplary embodiments, there is provided a display system including: a display panel including source lines, gate lines, and pixels; and a display driver IC configured to drive the display panel. The display driver IC includes: a charge pump including a first node and a second node; a flying capacitor connected between the first node and the second node; a voltage regulator; a first switch connected between an output terminal of the voltage regulator and one of the first node and the second node; and a second switch connected between a ground and the other of the first node and the second node.

According to an aspect of one or more other exemplary embodiments, there is provided a charge pump circuit for a display driver integrated circuit (IC), the charge pump circuit including: a charge pump including a first node and a second node; a flying capacitor connected between the first node and the second node; a first switch connected between a voltage input of the charge pump circuit and one of the first node and the second node; and a second switch connected between a ground and the other of the first node and the second node.

BRIEF DESCRIPTION OF THE DRAWINGS

The above and/or other features and advantages will become more apparent by describing in detail exemplary embodiments with reference to the attached drawings in which:

FIG. 14 is a timing chart showing the operation of the charge pump circuit illustrated in FIG. 13 according to one or more exemplary embodiments;

DETAILED DESCRIPTION OF EXEMPLARY EMBODIMENTS

Figure 1:
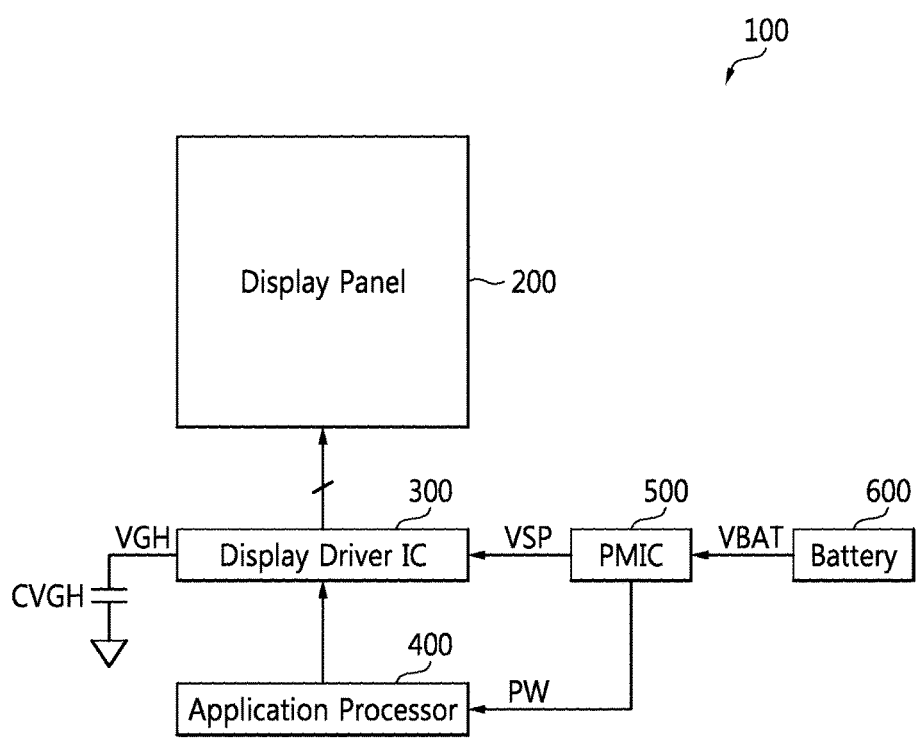
FIG. 1 is a block diagram of a display system according to one or more exemplary embodiments.

Exemplary embodiments will be described more fully hereinafter with reference to the accompanying drawings. Exemplary embodiments, however, be embodied in many different forms and should not be construed as limited to the exemplary embodiments set forth herein. Rather, these exemplary embodiments are provided so that this disclosure will be thorough and complete, and will fully convey the scope of the inventive concept(s) to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/". Furthermore, as used herein, expressions such as "at least one of," when preceding a list of elements, modify the entire list of elements and do not modify the individual elements of the list.

It will be understood that, although the terms first, second, etc., may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular exemplary embodiments only and is not intended to be limiting of the inventive concept(s). As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a display system 100 according to one or more exemplary embodiments. The display system 100 may include a display panel 200, a display driver IC (DDI) 300, an application processor 400, a power management integrated circuit (PMIC) 500, a battery 600, and an external capacitor CVGH. The display system 100 is a data processing system and may be implemented as or on a mobile device such as a laptop computer, a cellular phone, a smart phone, a tablet personal computer (PC), a personal digital assistant (PDA), an enterprise digital assistant (EDA), a digital still camera, a digital video camera, a portable multimedia player (PMP), a navigation device, a personal navigation device or portable navigation device (PND), a handheld game console, a mobile internet device (MID), a wearable computer, an internet of things (IoT) device, an internet of everything (IoE) device, a wearable device, a smart watch, a vehicle display, a digital picture frame, a drone, or an e-book. It is understood, however, that the display system 100 is not limited to a mobile or portable device, and may be implemented as or on any type of display device, including a monitor, a television, a digital sign, etc.

The display panel 200 may include a plurality of data lines, a plurality of gate lines, and a plurality of pixels. Each of the pixels may be connected to one of the data lines and to one of the gate lines respectively. The display panel 200 may display images according to the control of the DDI 300. The display panel 200 may be implemented as a flat panel display such as a thin film transistor-liquid crystal display (TFT-LCD), a light emitting diode (LED) display, an organic LED (OLED) display, an active-matrix OLED (AMOLED) display, a flexible display, etc.

The DDI 300 may receive image data corresponding to an image to be displayed on the display panel 200 and control signals (or synchronous signals) involved in transmission and/or display of the image data from the application processor 400. The DDI 300 may drive signals related to the image data to the display panel 200 using an operating voltage VSP transmitted or provided from the PMIC 500.

The PMIC 500 may generate the operating voltage VSP (e.g., first operating voltage) supplied to the DDI 300 and an operating voltage PW (e.g., second operating voltage) supplied to the application processor 400 using a battery voltage VBAT supplied from the battery 600. The battery 600 may be rechargeable. The battery 600 may be implemented as a flexible battery. The external capacitor CVGH storing a charge voltage VGH may be connected to a charge pump circuit, which will be described below.

The DDI 300 mounted on a substrate may be implemented in a chip-on-film (COF) package, a chip-on-glass (COG) package, a chip-on-flex package, a chip-on-board package, a tape carrier package (TCP), etc. The external capacitor CVGH may be placed as a surface-mount device (SMD) on the substrate of the above-mentioned packages.

Figure 2:
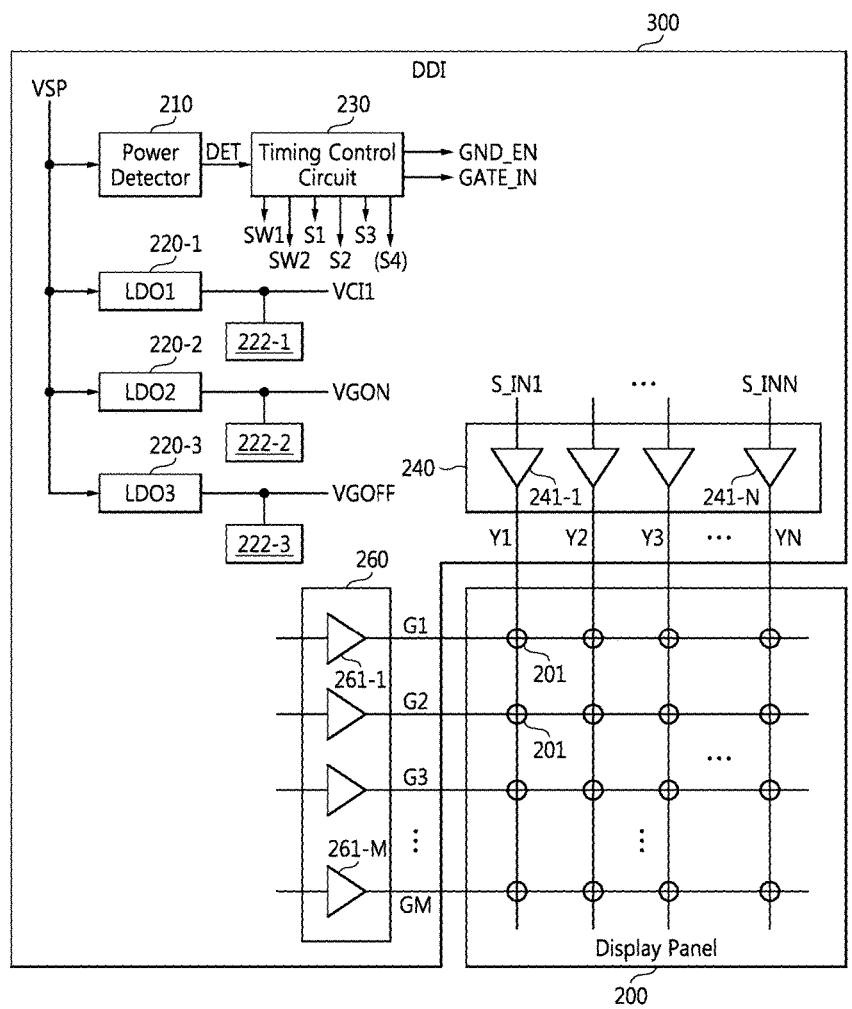
FIG. 2 is a block diagram of a display driver integrated circuit (IC) illustrated in FIG. 1.

FIG. 2 is a block diagram of the DDI 300 illustrated in FIG. 1. Referring to FIG. 2, the DDI 300 may include a power detector 210, a plurality of low dropout (LDO) voltage regulators 220-1, 220-2, and 220-3, a plurality of charge pump circuits 222-1, 222-2, and 222-3, a timing control circuit 230, a source driver circuit 240, and a gate driver circuit 260. For convenience of description, the display panel 200 including a plurality of pixels 201 is illustrated together with the DDI 300 in FIG. 2.

As shown in FIGS. 8 through 11, 14, 15A, 15B, 16 and 17, when the operating voltage VSP is less than a threshold voltage VTH due to abnormal power-off, the power detector 210 may generate or activate a detection signal DET.

The LDO voltage regulators 220-1, 220-2, and 220-3 may generate internal voltages VCI1, VGON, and VGOFF, respectively, using the operating voltage VSP. Each of the LDO voltage regulators 220-1 through 220-3 may be a capacitor-less LDO voltage regulator or an LDO voltage regulator including an external capacitor.

The charge pump circuits 222-1, 222-2, and 222-3 may be respectively connected to output terminals of the respective LDO voltage regulators 220-1, 220-2, and 220-3. The structure and operations of each of the charge pump circuits 222-1, 222-2, and 222-3 will be described in detail with reference to FIGS. 5A and 5B, 6-14, 15A, 15B, 16 and 17 below. Although the charge pump circuits 222-1, 222-2, and 222-3 are respectively connected to the output terminals of the respective LDO voltage regulators 220-1, 220-2, and 220-3 in the exemplary embodiment illustrated in FIG. 2, each of the charge pump circuits 222-1, 222-2, and 222-3 may be connected to an output terminal of another circuit included in the DDI 300 in one or more other exemplary embodiments.

The timing control circuit 230 may control the level of each of switch signals SW1, SW2, S1, S2, S3, and S4 in response to the detection signal DET being deactivated or activated. The timing control circuit 230 may generate control signals, e.g., a first enable signal GND_EN and a second enable signal GATE_IN. The timing control circuit 230 may control the source driver circuit 240 and the gate driver circuit 260.

The source driver circuit 240 may include a plurality of source drivers 241-1 through 241-N, where N is a natural number of at least 4. The source drivers 241-1 through 241-N may respectively generate source line driving signals Y1 through YN, which respectively drive source lines arranged in the display panel 200, using input signals S_IN1 through S_INN, respectively. The source lines may be referred to as data lines.

The gate driver circuit 260 may include a plurality of gate drivers 261-1 through 261-M, where M is a natural number of at least 4. The gate drivers 261-1 through 261-M may respectively generate gate line driving signals G1 through GM, which respectively drive gate lines arranged in the display panel 200.

Figure 3:
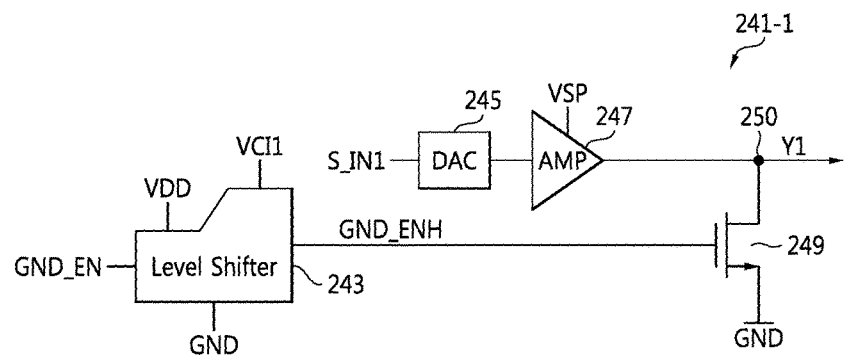
FIG. 3 is a block diagram of a source driver included in the display driver IC (DDI) illustrated in FIG. 2.

FIG. 3 is a block diagram of a source driver 241-1 included in the DDI 300 illustrated in FIG. 2. The source drivers 241-1 through 241-N illustrated in FIG. 2 have the same or similar structure as one another. Thus, the structure of a first source driver 241-1 will be representatively described. The first source driver 241-1 may include a level shifter 243, a digital-to-analog converter (DAC) 245, an amplifier 247, and a pull-down circuit 249.

The level shifter 243 may use a first voltage VDD, a second voltage VCI1, and a ground voltage GND as operating voltages and may generate a level-shifted voltage GND_ENH in response to the first enable signal GND_EN. The second voltage VCI1 is greater than the first voltage VDD.

The DAC 245 may convert a digital signal, i.e., the first input signal S_IN1, into an analog signal. The amplifier 247 may amplify the analog signal using the operating voltage VSP. The pull-down circuit 249 may maintain or pull down the voltage Y1 of an output terminal of the amplifier 247 to the ground voltage GND using the level-shifted voltage GND_ENH.

If the charge pump circuit 222-1 does not exist in the DDI 300, the second voltage VCI1 of the capacitor-less LDO voltage regulator 220-1 becomes 0 V and the amplifier 247 is disabled when the power of the operating voltage VSP is abnormally cut off. At this time, an output terminal 250 of the first source driver 241-1 enters a high-impedance state or a floating state, which may cause image sticking in the display panel 200.

When the charge pump circuit 222-1 is implemented in the DDI 300, the charge pump circuit 222-1 may perform a function of maintaining the second voltage VCI1 of the capacitor-less LDO voltage regulator 220-1 for a certain period of time even when the power of the operating voltage VSP is abnormally cut off, thereby suppressing occurrence of image sticking in the display panel 200.

Figure 4:
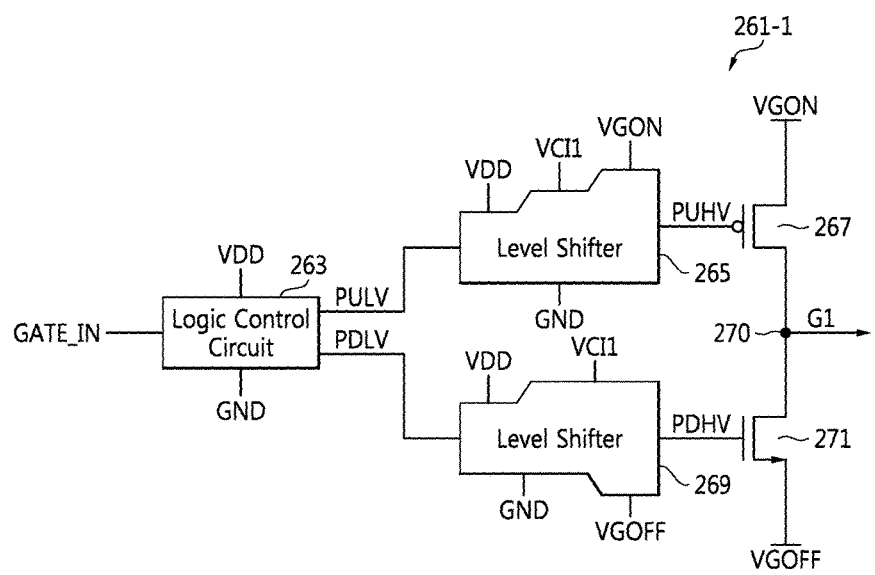
FIG. 4 is a block diagram of a gate driver included in the DDI illustrated in FIG. 2.

FIG. 4 is a block diagram of a gate driver 261-1 included in the DDI 300 illustrated in FIG. 2. The gate drivers 261-1 through 261-M illustrated in FIG. 2 have the same or similar structure as one another. Thus, the structure of a first gate driver 261-1 will be representatively described. The first gate driver 261-1 may include a logic control circuit 263, a first level shifter 265, a pull-up circuit 267, a second level shifter 269, and a pull-down circuit 271.

The logic control circuit 263 may receive the first voltage VDD and the ground voltage GND and may generate a first pull-up control signal PULV and a first pull-down control signal PDLV in response to the second enable signal GATE_IN.

The first level shifter 265 may receive the first voltage VDD, the second voltage VCI1, the third voltage VGON, and the ground voltage GND, and may shift the first pull-up control signal PULV from the first voltage VDD to the second voltage VCI1 and then to the third voltage VGON and generate a second pull-up control signal PUHV. The second pull-up control signal PUHV may swing between the third voltage VGON and the ground voltage GND. The pull-up circuit 267 may supply the third voltage VGON to an output terminal 270 of the first gate driver 261-1 in response to the second pull-up control signal PUHV. The third voltage VGON is greater than the second voltage VCI1.

The second level shifter 269 may receive the first voltage VDD, the second voltage VCI1, the fourth voltage VGOFF, and the ground voltage GND, and may generate a second pull-down control signal PDHV that swings between the second voltage VCI1 and the fourth voltage VGOFF from the first pull-down control signal PDLV that swings between the first voltage VDD and the ground voltage GND. The fourth voltage VGOFF may be less than the ground voltage GND. The pull-down circuit 271 may pull the voltage of the output terminal 270 of the first gate driver 261-1 down to the fourth voltage VGOFF in response to the second pull-down control signal PDHV.

If the charge pump circuits 222-1 through 222-3 do not exist in the DDI 300, the voltages VCI1, VGON, and VGOFF of the respective capacitor-less LDO voltage regulators 220-1 through 220-3 become 0 V when the power of the operating voltage VSP is abnormally cut off. At this time, the output terminal 270 of the first gate driver 261-1 enters a high-impedance state or a floating state, which may cause image sticking or functional error in the display panel 200.

When the charge pump circuits 222-1 through 222-3 are implemented in the DDI 300, the charge pump circuits 222-1 through 222-3 may perform a function of maintaining the voltages VCI1, VGON, and VGOFF of the respective capacitor-less LDO voltage regulators 220-1 through 220-3 for a certain period of time even if the power of the operating voltage VSP is abnormally cut off, thereby suppressing occurrence of image sticking and functional error in the display panel 200.

Figure 5A:
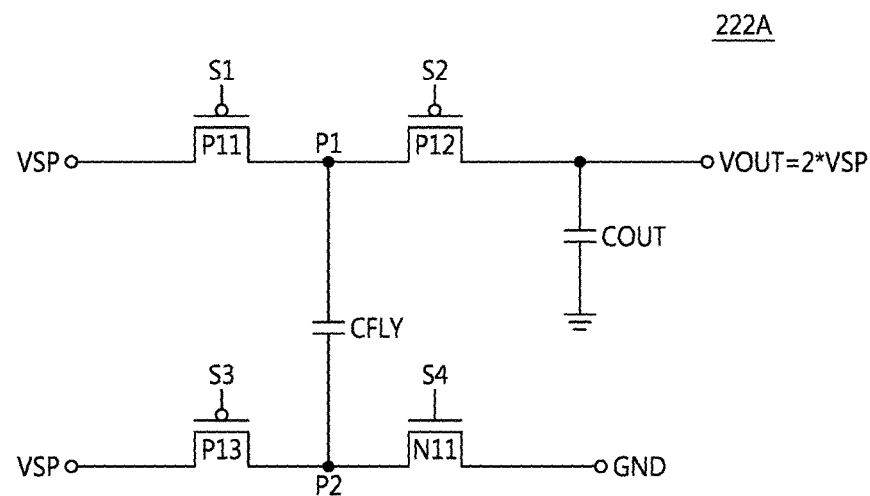
FIG. 5A is a circuit diagram of a charge pump circuit included in the DDI illustrated in FIG. 2.
Figure 5B:
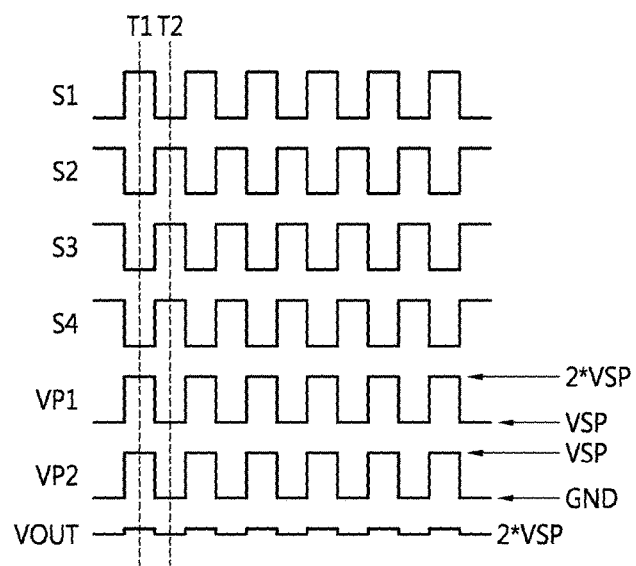
FIG. 5B is a timing chart showing the operation of the charge pump circuit illustrated in FIG. 5A.

FIG. 5A is a circuit diagram of a charge pump circuit 222A included in the DDI 300 illustrated in FIG. 2. FIG. 5B is a timing chart showing the operation of the charge pump circuit 222A illustrated in FIG. 5A. Here, the charge pump circuit 222A collectively or conceptually represents the charge pump circuits 222-1 through 222-3.

The charge pump circuit 222A may provide a power selection scheme using a flying capacitor CFLY in order to supply the voltages VCI1, VGON, and VGOFF to the source driver circuit 240 and the gate driver circuit 260 at the time of abnormal power-off. The charge pump circuit 222A may include a plurality of switches P11, P12, P13, and N11, the flying capacitor CFLY, and an output capacitor COUT. The output capacitor COUT may refer to the external capacitor CVGH. The flying capacitor CFLY may be connected between a first node P1 and a second node P2 and the output capacitor COUT may be connected between an output terminal of the charge pump circuit 222A and the ground GND.

FIG. 5B conceptually shows the waveforms of the switch signals S1, S2, S3, and S4 respectively applied to the switches P11, P12, P13, and N11, a voltage VP1 of the first node P1, a voltage VP2 of the second node P2, and an output voltage VOUT. The voltage VP1 of the first node P1 swings between VSP and 2*VSP. The voltage VP2 of the second node P2 swings between VSP and GND. Here, VSP denotes an external operating voltage supplied from the PMIC 500 and GND is the ground voltage.

In the present exemplary embodiment, it is assumed that each of the switches P11, P12, and P13 is implemented as a P-channel metal oxide semiconductor (PMOS) transistor, the switch N11 is implemented as an N-channel metal oxide semiconductor (NMOS) transistor, and charges corresponding to the operating voltage VSP are initially stored in the output capacitor COUT.

At a first time point T1, the switches P12 and P13 are turned on and the switches P11 and N11 are turned off, and therefore, the voltage VP1 of the first node P1 is 2*VSP and the voltage VP2 of the second node P2 is VSP. At a second time point T2, the switches P11 and N11 are turned on and the switches P12 and P13 are turned off, and therefore, the voltage VP1 of the first node P1 is VSP and the voltage VP2 of the second node P2 is GND.

The charge pump circuit 222A outputs a voltage of 2*VSP as the output voltage VOUT using the operating voltage VSP in the one or more exemplary embodiments illustrated in FIGS. 5A and 5B. However, the charge pump circuit 222A may be replaced with a different charge pump circuit that generates a voltage of k*VSP as the output voltage VOUT, where "k" is a natural number of at least 3, in one or more other exemplary embodiments.

Figure 6:
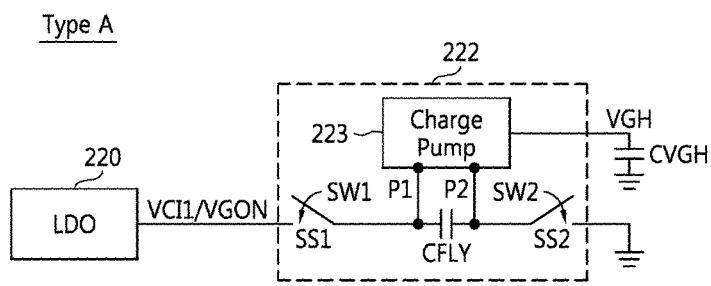
FIG. 6 is a diagram of a charge pump circuit and a capacitor-less voltage regulator according to one or more exemplary embodiments.

FIG. 6 is a diagram of the charge pump circuit 222 and a capacitor-less voltage regulator 220 according to one or more exemplary embodiments. Referring to FIGS. 2, 5A, 5B, and 6, the capacitor-less voltage regulator 220 may be connected to the first node P1 through a first switch SS1.

The capacitor-less voltage regulator 220 collectively or conceptually represents the capacitor-less LDO voltage regulators 220-1 through 220-3 and the charge pump circuit 222 collectively or conceptually represents the charge pump circuits 222-1 through 222-3. The charge pump circuit 222 may include a charge pump 223, the first switch SS1, a second switch SS2, and the flying capacitor CFLY.

The charge pump 223 is a kind of DC-DC converter using a capacitor as an energy storage element. Although the charge pump 223 is a positive charge pump in the exemplary embodiment illustrated in FIG. 6, the charge pump 223 may be a negative charge pump in one or more other exemplary embodiments.

The first switch SS1 may control the connection between an output terminal of the capacitor-less voltage regulator 220 and the first node P1 in response to the first switch signal SW1. The second switch SS2 may control the connection between the second node P2 and the ground in response to the second switch signal SW2. The flying capacitor CFLY may be connected between the first node P1 and the second node P2. In other words, the first switch SS1 may be directly connected to the output terminal of the capacitor-less voltage regulator 220.

Figure 7:
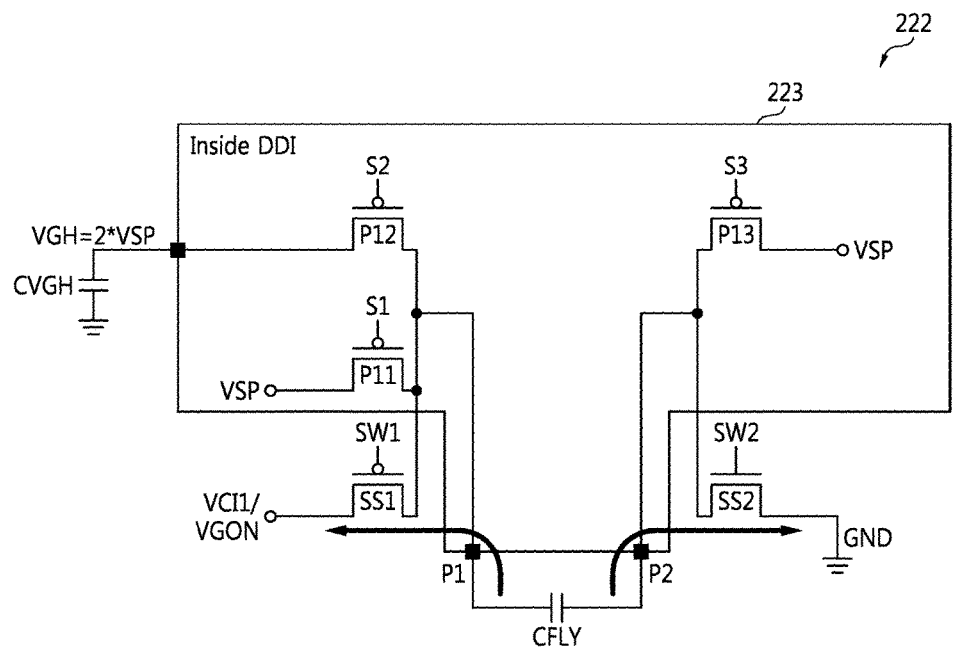
FIG. 7 is a circuit diagram of the charge pump circuit illustrated in FIG. 6.

FIG. 7 is a circuit diagram of the charge pump circuit 223 illustrated in FIG. 6. Referring to FIGS. 5A, 5B, 6 and 7, unlike a charge pump 222A illustrated in FIG. 5A, the charge pump 223 illustrated in FIG. 7 does not include the switch N11. At this time, the timing control circuit 230 illustrated in FIG. 2 does not generate the switch signal S4. Here, the voltage VGH is the same as the voltage VOUT and the capacitor CVGH is the same as the capacitor COUT.

Figure 8:
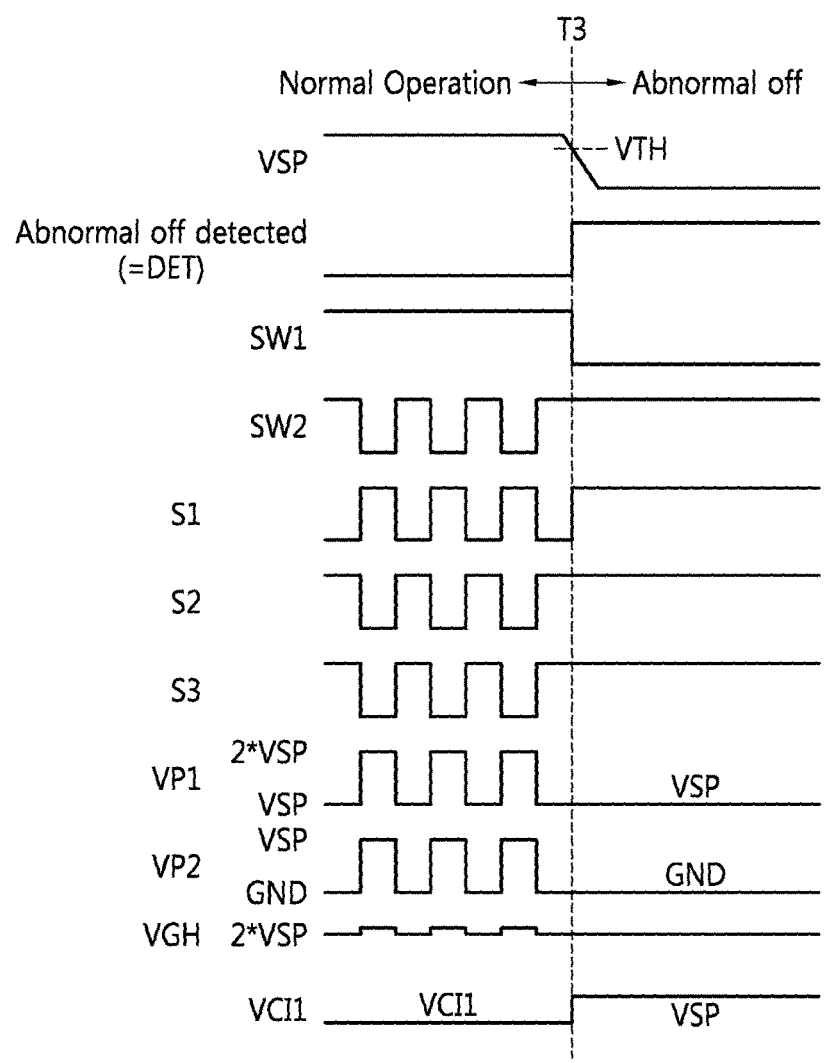
FIG. 8 is a timing chart showing the operation of the charge pump circuit illustrated in FIG. 7 according to one or more exemplary embodiments.

FIG. 8 is a timing chart showing the operation of the charge pump circuit 223 illustrated in FIG. 7 according to one or more exemplary embodiments. As shown in FIG. 8, it is assumed that abnormal power-off occurs when the voltage VP1 of the first node P1 is VSP and the voltage VP2 of the second node P2 is GND. It is also assumed, in the present exemplary embodiment, that the capacitor-less voltage regulator 220 is the capacitor-less LDO voltage regulator 220-1 that generates the second voltage VCI1 and the charge pump circuit 222 is the charge pump circuit 222-1.

When the operating voltage VSP is less than the threshold voltage VTH at a third time point T3 due to abnormal power-off, the power detector 210 outputs the activated detection signal DET to the timing control circuit 230. The timing control circuit 230 generates the switch signals SW1, SW2, S1, S2, and S3 that have the waveforms shown in FIG. 8 in response to the activated detection signal DET.

At the third time point T3, the switches P11, P12, and P13 are turned off by the switch signals S1, S2, and S3, respectively. Thereafter, the switches SS1 and SS2 are turned on. Accordingly, the second voltage VCI1 is increased to the operating voltage VSP since the first node P1 is connected to the output terminal of the capacitor-less LDO voltage regulator 220-1 through the first switch SS1. The voltage VP2 of the second node P2 is maintained at GND since the second node P2 is connected to the ground through the second switch SS2.

Figure 9:
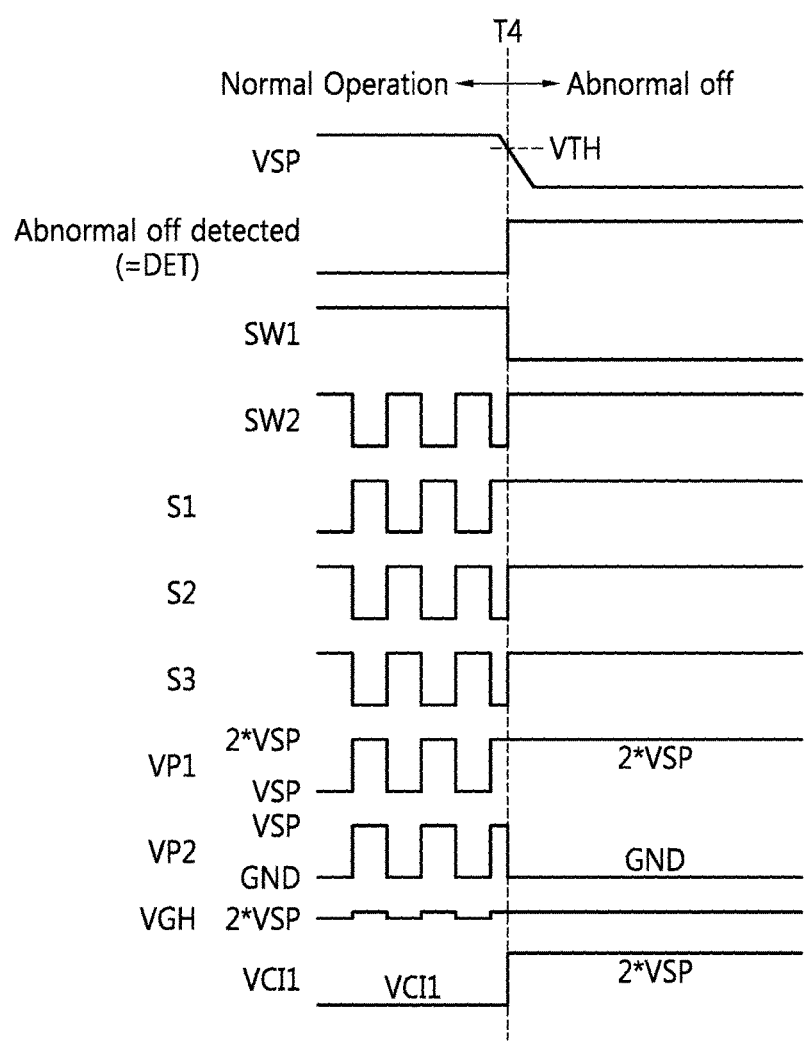
FIG. 9 is a timing chart showing the operation of the charge pump circuit illustrated in FIG. 7 according to one or more other exemplary embodiments.

FIG. 9 is a timing chart showing the operation of the charge pump circuit 223 illustrated in FIG. 7 according to one or more other exemplary embodiments. As shown in FIG. 9, it is assumed that abnormal power-off occurs when the voltage VP1 of the first node P1 is 2*VSP and the voltage VP2 of the second node P2 is VSP. It is also assumed, in the present exemplary embodiment, that the capacitor-less voltage regulator 220 is the capacitor-less LDO voltage regulator 220-1 that generates the second voltage VCI1 and the charge pump circuit 222 is the charge pump circuit 222-1.

When the operating voltage VSP is less than the threshold voltage VTH at a fourth time point T4 due to abnormal power-off, the power detector 210 outputs the activated detection signal DET to the timing control circuit 230. The timing control circuit 230 generates the switch signals SW1, SW2, S1, S2, and S3 that have the waveforms shown in FIG. 9 in response to the activated detection signal DET.

At the fourth time point T4, the switches P11, P12, and P13 are turned off by the switch signals S1, S2, and S3, respectively. Thereafter, the switches SS1 and SS2 are turned on. Accordingly, the second voltage VCI1 is increased to 2*VSP since the first node P1 is connected to the output terminal of the capacitor-less LDO voltage regulator 220-1 through the first switch SS1. The voltage VP2 of the second node P2 is discharged down to GND from VSP since the second node P2 is connected to the ground through the second switch SS2.

Figure 10:
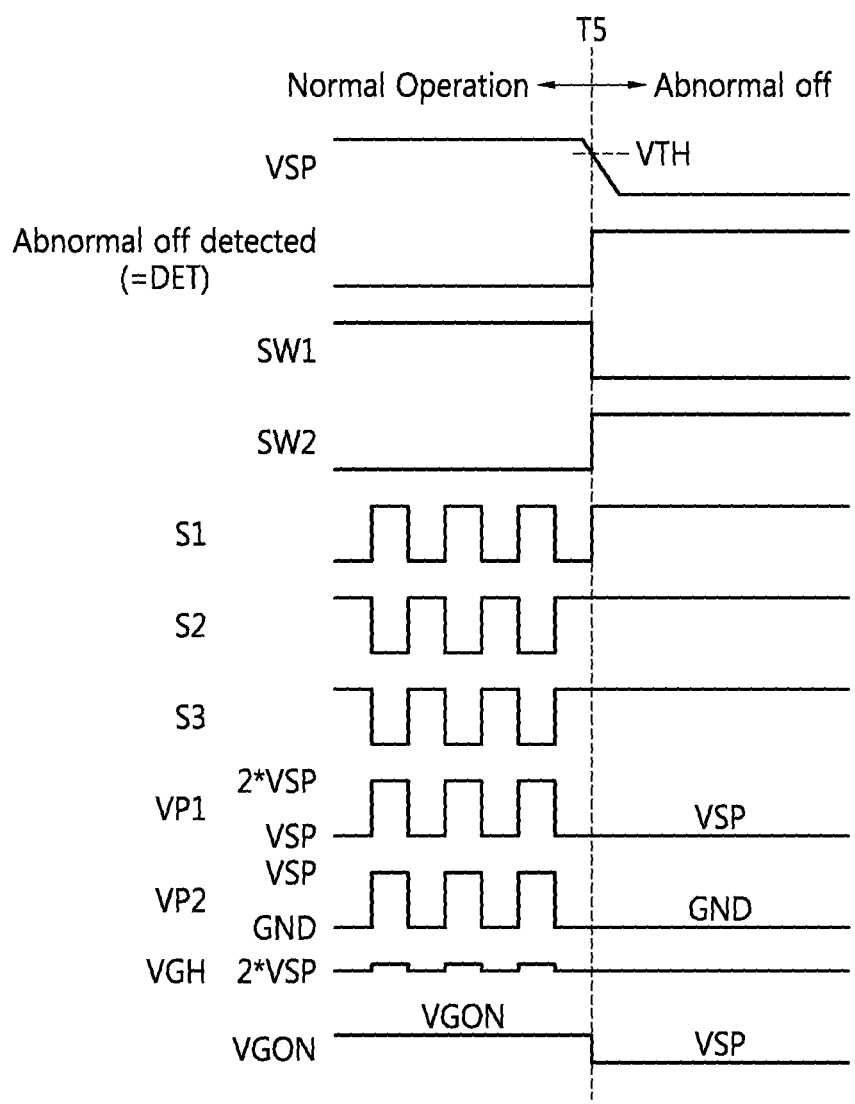
FIG. 10 is a timing chart showing the operation of the charge pump circuit illustrated in FIG. 7 according to still one or more other exemplary embodiments.

FIG. 10 is a timing chart showing the operation of the charge pump circuit 223 illustrated in FIG. 7 according to still one or more other exemplary embodiments. As shown in FIG. 10, it is assumed that abnormal power-off occurs when the voltage VP1 of the first node P1 is VSP and the voltage VP2 of the second node P2 is GND. It is also assumed, in the present exemplary embodiment, that the capacitor-less voltage regulator 220 is the capacitor-less LDO voltage regulator 220-2 that generates the third voltage VGON and the charge pump circuit 222 is the charge pump circuit 222-2.

When the operating voltage VSP is less than the threshold voltage VTH at a fifth time point T5 due to abnormal power-off, the power detector 210 outputs the activated detection signal DET to the timing control circuit 230. The timing control circuit 230 generates the switch signals SW1, SW2, S1, S2, and S3 that have the waveforms shown in FIG. 10 in response to the activated detection signal DET.

At the fifth time point T5, the switches P11, P12, and P13 are turned off by the switch signals S1, S2, and S3, respectively. Thereafter, the switches SS1 and SS2 are turned on. Accordingly, the third voltage VGON is decreased to the operating voltage VSP since the first node P1 is connected to the output terminal of the capacitor-less LDO voltage regulator 220-2 through the first switch SS1. The voltage VP2 of the second node P2 is maintained at GND since the second node P2 is connected to the ground through the second switch SS2.

Figure 11:
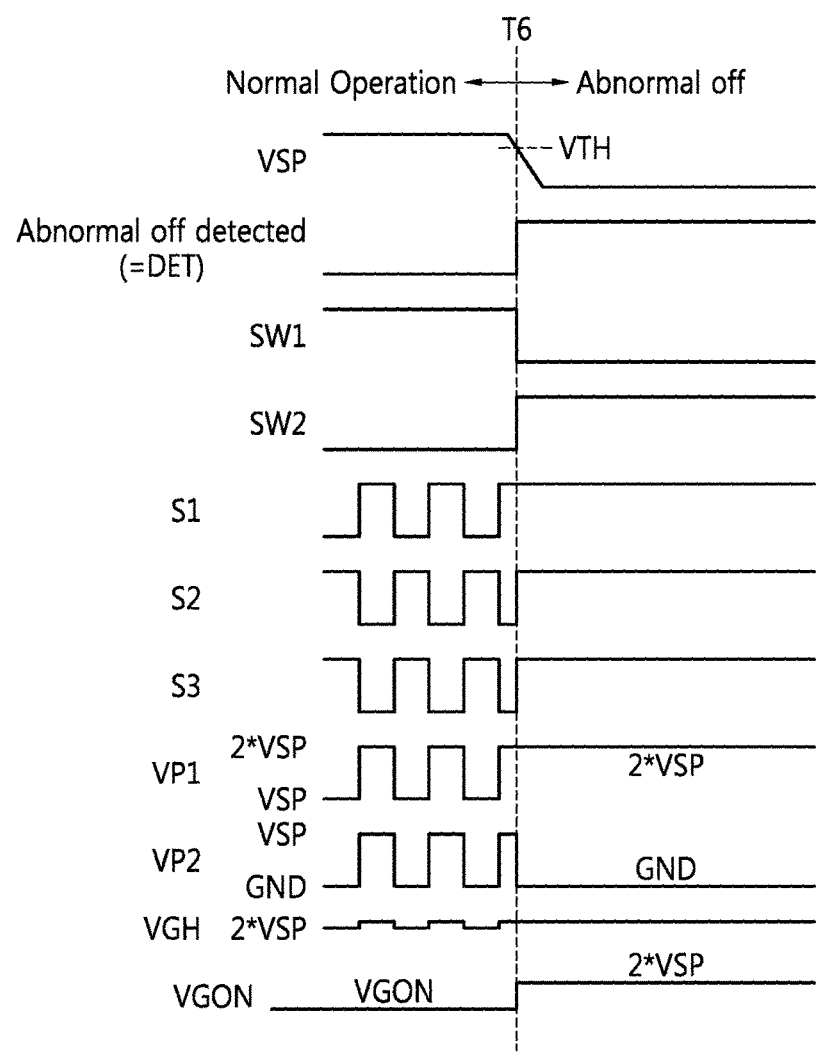
FIG. 11 is a timing chart showing the operation of the charge pump circuit illustrated in FIG. 7 according to one or more further exemplary embodiments.

FIG. 11 is a timing chart showing the operation of the charge pump circuit 223 illustrated in FIG. 7 according to one or more further exemplary embodiments. As shown in FIG. 11, it is assumed that abnormal power-off occurs when the voltage VP1 of the first node P1 is 2*VSP and the voltage VP2 of the second node P2 is VSP. It is also assumed, in the present exemplary embodiment, that the capacitor-less voltage regulator 220 is the capacitor-less LDO voltage regulator 220-2 that generates the third voltage VGON and the charge pump circuit 222 is the charge pump circuit 222-2.

When the operating voltage VSP is less than the threshold voltage VTH at a sixth time point T6 due to abnormal power-off, the power detector 210 outputs the activated detection signal DET to the timing control circuit 230. The timing control circuit 230 generates the switch signals SW1, SW2, S1, S2, and S3 that have the waveforms shown in FIG. 11 in response to the activated detection signal DET.

At the sixth time point T6, the switches P11, P12, and P13 are turned off by the switch signals S1, S2, and S3, respectively. Thereafter, the switches SS1 and SS2 are turned on. Accordingly, the third voltage VGON is increased to 2*VSP since the first node P1 is connected to the output terminal of the capacitor-less LDO voltage regulator 220-2 through the first switch SS1. The voltage VP2 of the second node P2 is discharged down to GND from VSP since the second node P2 is connected to the ground through the second switch SS2.

Figure 12:
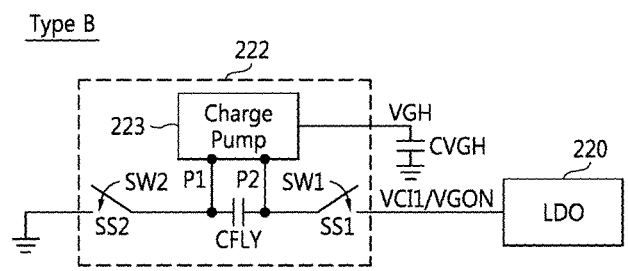
FIG. 12 is a diagram of a charge pump circuit and a capacitor-less voltage regulator according to one or more other exemplary embodiments.

FIG. 12 is a diagram of the charge pump circuit 222 and the capacitor-less voltage regulator 220 according to one or more other exemplary embodiments. Referring to FIGS. 2, 5A, 5B, and 12, the capacitor-less voltage regulator 220 may be connected to the second node P2 through a first switch SS1. The capacitor-less voltage regulator 220 collectively or conceptually represents the capacitor-less LDO voltage regulators 220-1 through 220-3 and the charge pump circuit 222 collectively or conceptually represents the charge pump circuits 222-1 through 222-3.

Figure 13:
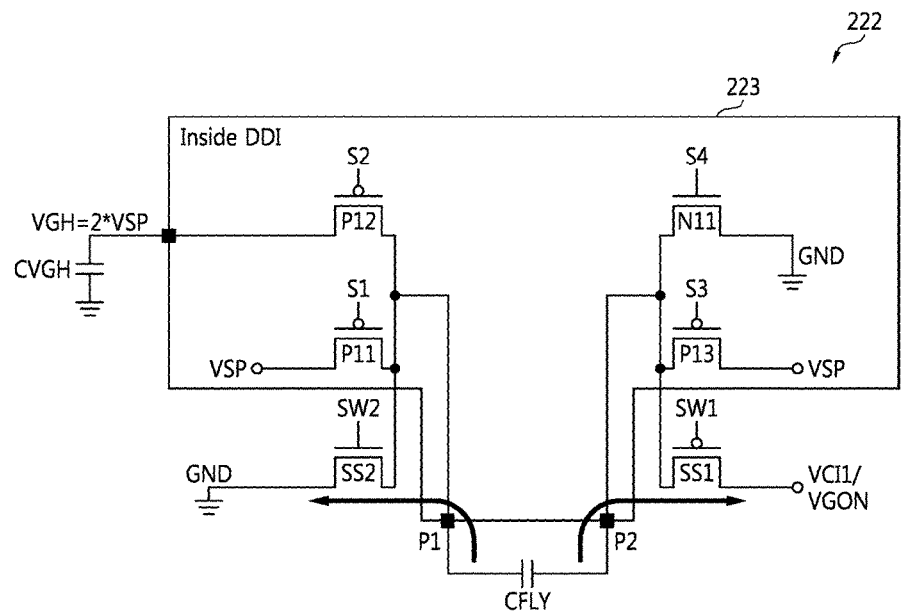
FIG. 13 is a circuit diagram of the charge pump circuit illustrated in FIG. 12.

FIG. 13 is a circuit diagram of the charge pump 223 illustrated in FIG. 12. Referring to FIGS. 5A, 5B, 12, and 13, the charge pump 223 illustrated in FIG. 13 is the same as or similar to the charge pump 223 illustrated in FIG. 5A.

FIG. 14 is a timing chart showing the operation of the charge pump circuit 223 illustrated in FIG. 13 according to one or more exemplary embodiments. As shown in FIG. 14, it is assumed that abnormal power-off occurs when the voltage VP1 of the first node P1 is GND and the voltage VP2 of the second node P2 is VSP. It is also assumed, in the present exemplary embodiment, that the capacitor-less voltage regulator 220 is the capacitor-less LDO voltage regulator 220-1 that generates the second voltage VCI1 and the charge pump circuit 223 is or corresponds to the charge pump circuit 222-1.

When the operating voltage VSP is less than the threshold voltage VTH at a seventh time point T7 due to abnormal power-off, the power detector 210 outputs the activated detection signal DET to the timing control circuit 230. The timing control circuit 230 generates the switch signals SW1, SW2, S1, S2, S3, and S4 that have the waveforms shown in FIG. 14 in response to the activated detection signal DET.

At an eighth time point T8, the switches P11, P12, P13, and N11 are turned off by the switch signals S1, S2, S3, and S4, respectively. Thereafter, the switches SS1 and SS2 are turned on. Accordingly, the second voltage VCI1 is increased to the operating voltage VSP since the second node P2 is connected to the output terminal of the capacitor-less LDO voltage regulator 220-1 through the first switch SS1. The voltage VP1 of the first node P1 is maintained at GND since the first node P1 is connected to the ground through the second switch SS2.

Figure 15A:
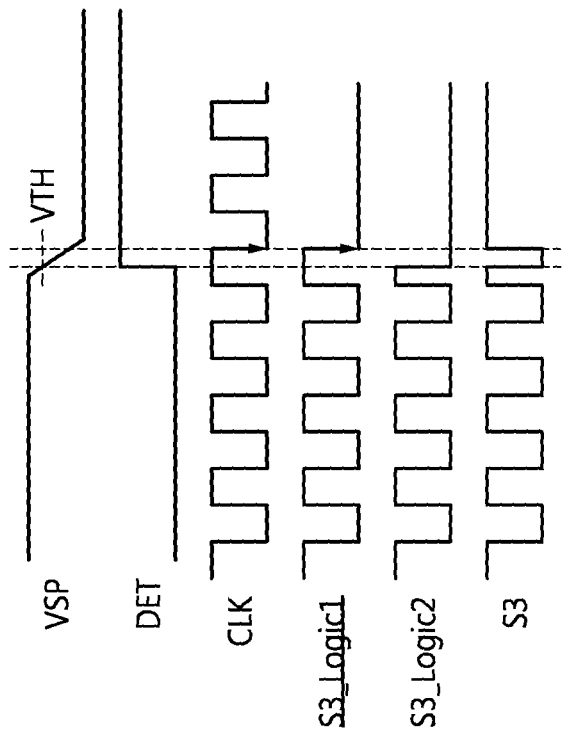
FIG. 15A is a diagram of a logic circuit included in a timing control circuit illustrated in FIG. 2.
Figure 15B:
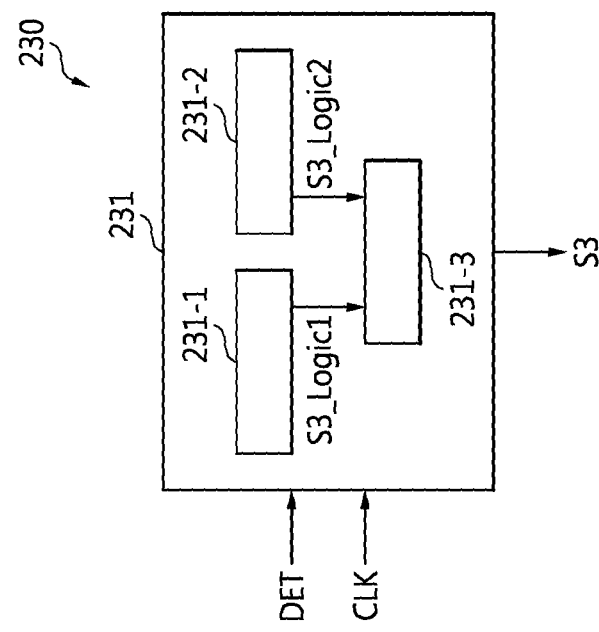
FIG. 15B is a timing chart of input/output signals of the logic circuit of FIG. 15A.

FIG. 15A is a diagram of a logic circuit 231 included in the timing control circuit 230 illustrated in FIG. 2. FIG. 15B is a timing chart of input/output signals of the logic circuit 231. Referring to FIGS. 2 and 15A, the timing control circuit 230 may include the logic circuit 231 that generates the switch signal S3. The logic circuit 231 may generate the switch signal S3 illustrated in FIGS. 14 and 17. The logic circuit 231 may include a first switch logic circuit 231-1 and a second switch logic circuit 231-2.

The first switch logic circuit 231-1 may latch a first falling edge of a clock signal CLK after the detection signal DET is activated when abnormal power-off occurs. The second switch logic circuit 231-2 may gate the clock signal CLK when abnormal power-off occurs. In other words, the second switch logic circuit 231-2 may block the transmission of the clock signal CLK when abnormal power-off occurs.

Figure 17:
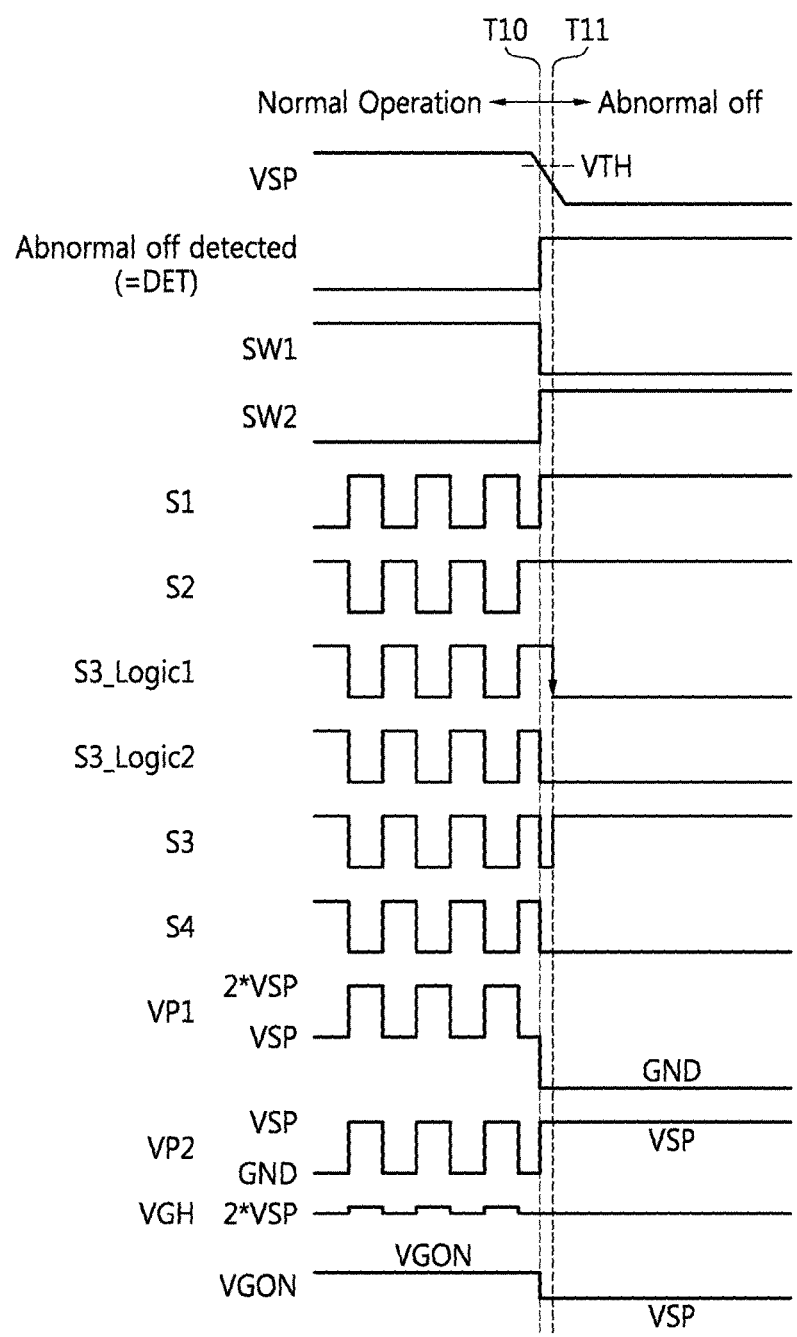
FIG. 17 is a timing chart showing the operation of the charge pump circuit illustrated in FIG. 13 according to still one or more other exemplary embodiments.

The logic circuit 231 may also include a third switch logic circuit 231-3 which generates the switch signal S3 having the timing shown in FIGS. 14 and 17 using an output signal of the first switch logic circuit 231-1 and an output signal of the second switch logic circuit 231-2 when abnormal power-off occurs.

Figure 16:
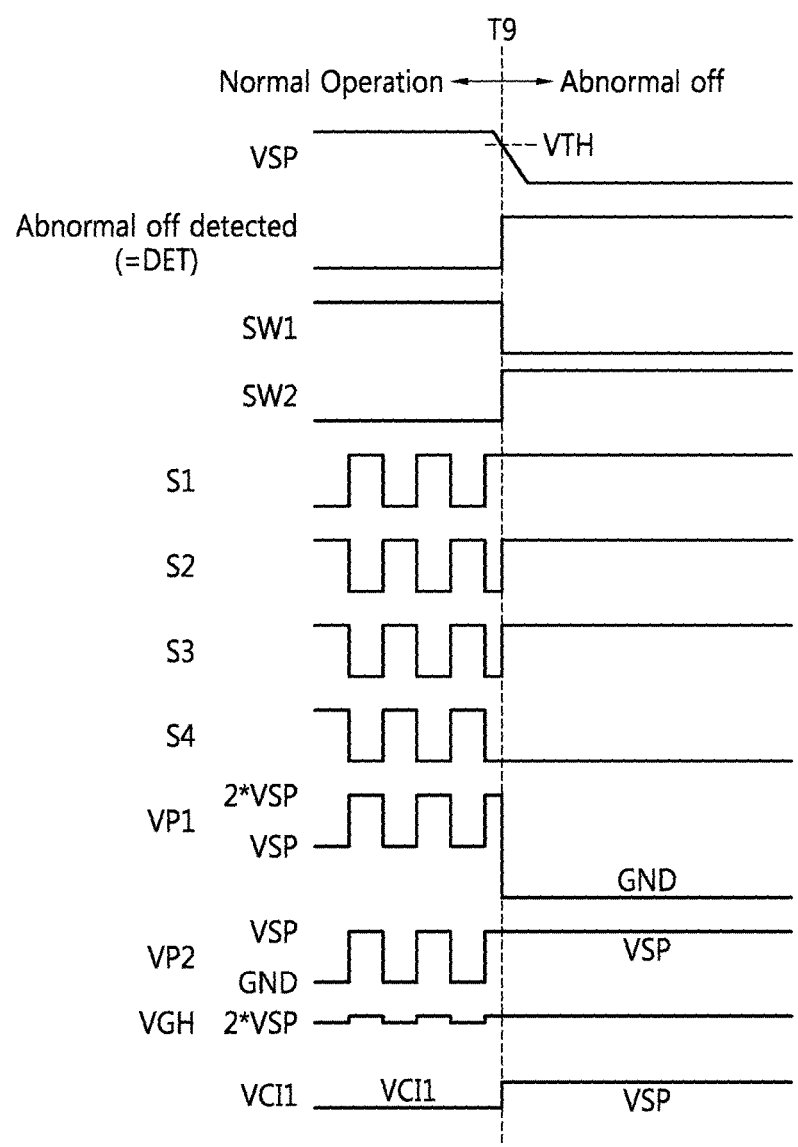
FIG. 16 is a timing chart showing the operation of the charge pump circuit illustrated in FIG. 13 according to one or more other exemplary embodiments.

FIG. 16 is a timing chart showing the operation of the charge pump circuit 223 illustrated in FIG. 13 according to one or more other exemplary embodiments. As shown in FIG. 16, it is assumed that abnormal power-off occurs when the voltage VP1 of the first node P1 is GND and the voltage VP2 of the second node P2 is VSP. It is also assumed, in the present exemplary embodiment, that the capacitor-less voltage regulator 220 is the capacitor-less LDO voltage regulator 220-1 that generates the second voltage VCI1 and the charge pump circuit 222 is the charge pump circuit 222-1.

When the operating voltage VSP is less than the threshold voltage VTH at a ninth time point T9 due to abnormal power-off, the power detector 210 outputs the activated detection signal DET to the timing control circuit 230. The timing control circuit 230 generates the switch signals SW1, SW2, S1, S2, S3, and S4 that have the waveforms shown in FIG. 16 in response to the activated detection signal DET.

At the ninth time point T9, the switches P11, P12, P13, and N11 shown in FIG. 13 are turned off by the switch signals S1, S2, S3, and S4, respectively. Thereafter, the switches SS1 and SS2 are turned on. Accordingly, the second voltage VCI1 is increased to the operating voltage VSP since the second node P2 is connected to the output terminal of the capacitor-less LDO voltage regulator 220-1 through the first switch SS1. The voltage VP1 of the first node P1 is maintained at GND since the first node P1 is connected to the ground through the second switch SS2.

FIG. 17 is a timing chart showing the operation of the charge pump circuit 223 illustrated in FIG. 13 according to still one or more other exemplary embodiments. As shown in FIG. 17, it is assumed that abnormal power-off occurs when the voltage VP1 of the first node P1 is GND and the voltage VP2 of the second node P2 is VSP. It is also assumed, in the present exemplary embodiment, that the capacitor-less voltage regulator 220 is the capacitor-less LDO voltage regulator 220-2 that generates the third voltage VGON and the charge pump circuit 222 is the charge pump circuit 222-2.

When the operating voltage VSP is less than the threshold voltage VTH at a tenth time point T10 due to abnormal power-off, the power detector 210 outputs the activated detection signal DET to the timing control circuit 230. The timing control circuit 230 generates the switch signals SW1, SW2, S1, S2, S3, and S4 that have the waveforms shown in FIG. 17 in response to the activated detection signal DET.

At an eleventh time point T11, the switches P11, P12, P13, and N11 shown in FIG. 13 are turned off by the switch signals S1, S2, S3, and S4, respectively. Thereafter, the switches SS1 and SS2 are turned on. Accordingly, the third voltage VGON is decreased to the operating voltage VSP since the second node P2 is connected to the output terminal of the capacitor-less LDO voltage regulator 220-2 through the first switch SS1. The voltage VP1 of the first node P1 is maintained at GND since the first node P1 is connected to the ground through the second switch SS2.

Figure 18:
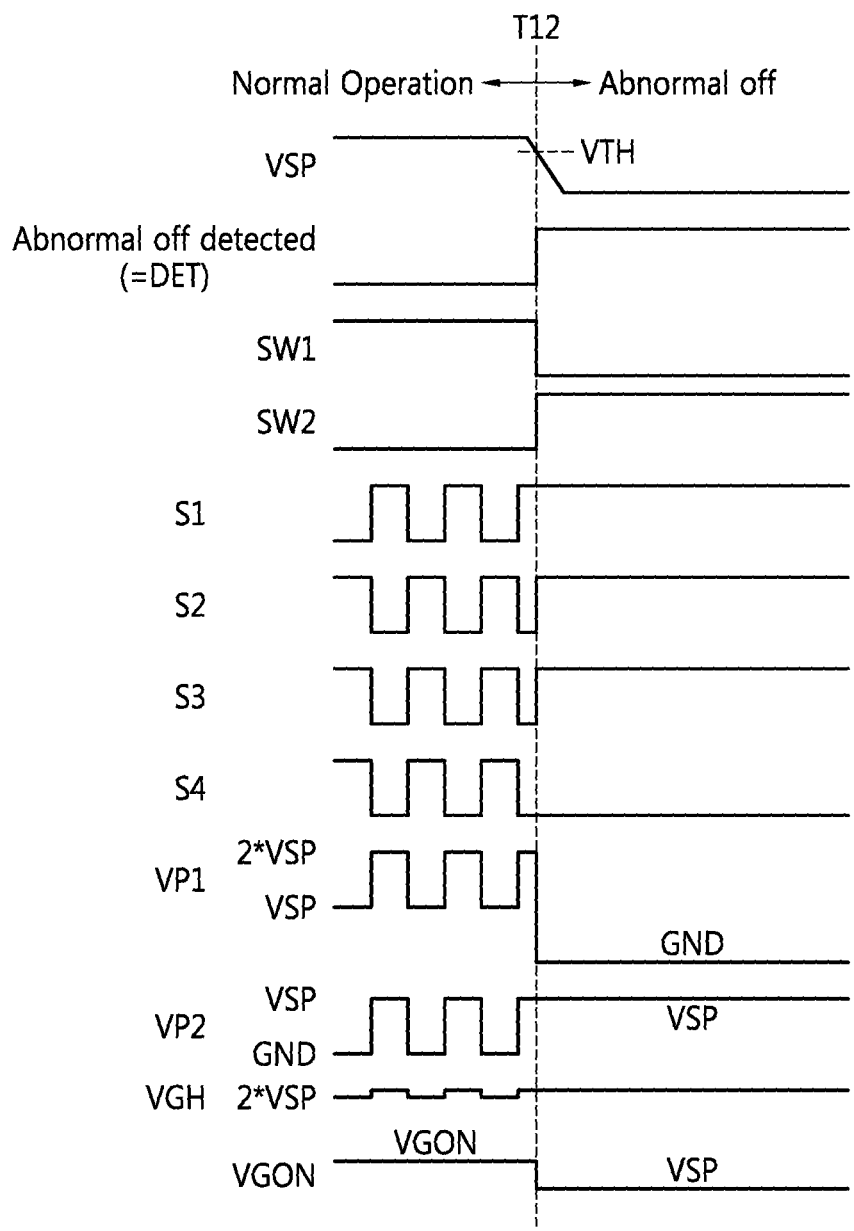
FIG. 18 is a timing chart showing the operation of the charge pump circuit illustrated in FIG. 13 according to one or more further exemplary embodiments.

FIG. 18 is a timing chart showing the operation of the charge pump circuit 223 illustrated in FIG. 13 according to one or more further exemplary embodiments. As shown in FIG. 18, it is assumed that abnormal power-off occurs when the voltage VP1 of the first node P1 is 2*VSP and the voltage VP2 of the second node P2 is VSP. It is also assumed, in the present exemplary embodiment, that the capacitor-less voltage regulator 220 is the capacitor-less LDO voltage regulator 220-2 that generates the third voltage VGON and the charge pump circuit 222 is the charge pump circuit 222-2.

When the operating voltage VSP is less than the threshold voltage VTH at a twelfth time point T12 due to abnormal power-off, the power detector 210 outputs the activated detection signal DET to the timing control circuit 230. The timing control circuit 230 generates the switch signals SW1, SW2, S1, S2, S3, and S4 that have the waveforms shown in FIG. 18 in response to the activated detection signal DET.

At the twelfth time point T12, the switches P11, P12, P13, and N11 shown in FIG. 13 are turned off by the switch signals S1, S2, S3, and S4, respectively. Thereafter, the switches SS1 and SS2 are turned on. Accordingly, the third voltage VGON is decreased to the operating voltage VSP since the second node P2 is connected to the output terminal of the capacitor-less LDO voltage regulator 220-2 through the first switch SS1. The voltage VP1 of the first node P1 is decreased from 2*VSP to GND since the first node P1 is connected to the ground through the second switch SS2.

As described above, according to one or more exemplary embodiments, a DDI including a capacitor-less voltage regulator prevents functional errors and image sticking from occurring in a display panel when power supplied to the DDI is abnormally turned off.

While exemplary embodiments have been particularly shown and described above, it will be understood by those of ordinary skill in the art that various changes in forms and details may be made therein without departing from the spirit and scope of the inventive concept(s) as defined by the following claims.

What is claimed is:

1. A display driver integrated circuit (IC) comprising:
a charge pump comprising a first node and a second node;
a flying capacitor connected between the first node and the second node;
a voltage regulator;
a first switch connected between an output terminal of the voltage regulator and one of the first node and the second node;
a second switch connected between a ground and the other of the first node and the second node; and
a timing control circuit configured to generate first switch signals for turning on the first switch and the second switch in response to an abnormal power-off of an operating voltage supplied to the display driver IC.

2. The display driver IC of claim 1, wherein the timing control circuit is configured to generate second switch signals for turning off all switches comprised in the charge pump in response to the abnormal power-off of the operating voltage supplied to the display driver IC.

3. The display driver IC of claim 1, wherein the abnormal power-off is detected when the operating voltage is less than a threshold voltage.

4. The display driver IC of claim 1, further comprising:
a source driver circuit and a gate driver circuit,
wherein charges stored in the flying capacitor are provided to at least one circuit among the source driver circuit and the gate driver circuit through the first switch that has been turned on when the abnormal power-off is detected.

5. The display driver IC of claim 4, wherein a charge voltage corresponding to the charges stored in the flying capacitor is greater than or equal to the operating voltage and is greater than an output voltage of the voltage regulator.

6. The display driver IC of claim 4, wherein a charge voltage corresponding to the charges stored in the flying capacitor is greater than or equal to the operating voltage and is less than an output voltage of the voltage regulator.

7. The display driver IC of claim 1, wherein a voltage of the one of the first node and the second node is greater than a voltage of the other of the first node and the second node.

8. The display driver IC of claim 1, wherein a voltage of the one of the first node and the second node is less than a voltage of the other of the first node and the second node.

9. The display driver IC of claim 1, wherein the voltage regulator is a capacitor-less low dropout voltage regulator.

10. A display system comprising:
a display panel comprising source lines, gate lines, and pixels; and
a display driver integrated circuit (IC) configured to drive the display panel, the display driver IC comprising:

a charge pump comprising a first node and a second node, a flying capacitor connected between the first node and the second node, a voltage regulator, a first switch connected between an output terminal of the voltage regulator and one of the first node and the second node, a second switch connected between a ground and the other of the first node and the second node, and a timing control circuit configured to generate first switch signals for turning on the first switch and the second switch in response to an abnormal power-off of an operating voltage supplied to the display driver IC.

11. The display system of claim 10, wherein:

the display driver IC further comprises:

a source driver circuit configured to drive the source lines, and a gate driver circuit configured to drive the gate lines; and charges stored in the flying capacitor are provided to at least one circuit among the source driver circuit and the gate driver circuit through the first switch that has been turned on when the abnormal power-off is detected.

12. The display system of claim 11, wherein the display driver IC is comprised in a chip-on-film (COF) package, a chip-on-glass (COG) package, a chip-on-flex package, a chip-on-board package, or a tape carrier package (TCP).

13. The display system of claim 10, wherein the voltage regulator is a capacitor-less low dropout voltage regulator.

14. A charge pump circuit for a display driver integrated circuit (IC), the charge pump circuit comprising:

a charge pump comprising a first node and a second node;

a flying capacitor connected between the first node and the second node;

a first switch connected between a voltage input of the charge pump circuit and one of the first node and the second node; and a second switch connected between a ground and the other of the first node and the second node, wherein the first switch is configured to be turned on when an abnormal power-off of the display driver IC occurs, such that charges stored in the flying capacitor are output through the first switch that has been turned on.

15. The charge pump circuit of claim 14, wherein a charge voltage corresponding to the charges stored in the flying capacitor is greater than or equal to an operating voltage of the display driver IC and is greater than a voltage provided via the voltage input.

16. The charge pump circuit of claim 14, wherein a charge voltage corresponding to the charges stored in the flying capacitor is greater than or equal to an operating voltage of the display driver IC and is less than a voltage provided via the voltage input.

17. The charge pump circuit of claim 14, wherein a voltage of the one of the first node and the second node is greater than a voltage of the other of the first node and the second node.

* * * * *